US008120047B2

(12) United States Patent
Kim et al.

(10) Patent No.: US 8,120,047 B2
(45) Date of Patent: Feb. 21, 2012

(54) III-NITRIDE SEMICONDUCTOR LIGHT EMITTING DEVICE

(75) Inventors: Chang Tae Kim, Seongnam-si (KR); Min Gyu Na, Gimje-si (KR)

(73) Assignee: Epivalley Co., Ltd., Gumi, Gyungbuk (KR)

( * ) Notice: Subject to any disclaimer, the term of this patent is extended or adjusted under 35 U.S.C. 154(b) by 179 days.

(21) Appl. No.: 12/648,670

(22) Filed: Dec. 29, 2009

(65) Prior Publication Data

US 2010/0096651 A1    Apr. 22, 2010

Related U.S. Application Data

(63) Continuation of application No. PCT/KR2009/005492, filed on Sep. 25, 2009.

(30) Foreign Application Priority Data

Sep. 25, 2008 (KR) .......................... 10-2008-0093969

(51) Int. Cl.
    *H01L 33/00* (2010.01)
(52) U.S. Cl. ..... 257/94; 257/79; 257/103; 257/E33.023; 257/E33.025; 257/E33.028; 257/E33.065
(58) Field of Classification Search .................. 257/79, 257/94, 103, E33.023, 25, 28, 65
    See application file for complete search history.

(56) References Cited

U.S. PATENT DOCUMENTS

| 5,122,845 | A | 6/1992 | Manabe et al. |
| 5,247,533 | A | 9/1993 | Okazaki et al. |
| 5,290,393 | A | 3/1994 | Nakamura |
| 5,306,662 | A | 4/1994 | Nakamura et al. |
| 5,563,422 | A | 10/1996 | Nakamura et al. |
| 5,733,796 | A | 3/1998 | Manabe et al. |
| 6,194,743 | B1 | 2/2001 | Kondoh et al. |
| 6,515,306 | B2 | 2/2003 | Kuo et al. |
| 7,276,742 | B2 * | 10/2007 | Kohno et al. ................. 257/103 |
| 7,488,988 | B2 * | 2/2009 | Lin et al. ......................... 257/94 |
| 2008/0211416 | A1 * | 9/2008 | Negley et al. ................. 315/193 |

FOREIGN PATENT DOCUMENTS

| JP | 08-083929 | 3/1996 |
| JP | 2004-297096 | 10/2004 |
| JP | 2007-287849 | 11/2007 |
| WO | 2005/022655 | 3/2005 |
| WO | 2005/053042 | 6/2005 |
| WO | 2008/026902 | 3/2008 |

* cited by examiner

*Primary Examiner* — Minchul Yang
(74) *Attorney, Agent, or Firm* — Harness, Dickey & Pierce, P.L.C.

(57) ABSTRACT

The present disclosure relates to a III-nitride semiconductor light-emitting device including a substrate with a first groove and a second groove formed therein, the substrate including a first surface and a second surface opposite to the first surface, a plurality of III-nitride semiconductor layers including a first semiconductor layer formed over the first surface of the substrate, a second semiconductor layer formed over the first III-nitride semiconductor layer, and an active layer disposed between the first and second III-nitride semiconductor layers and generating light by recombination of electrons and holes, a first opening formed on the first groove, a second opening formed on the second groove, a first electrode electrically connected from the second surface to the first III-nitride semiconductor layer through the first groove, and a second electrode electrically connected from the second surface to the second III-nitride semiconductor layer through the second groove and the second opening.

12 Claims, 5 Drawing Sheets

III-NITRIDE SEMICONDUCTOR LIGHT EMITTING DEVICE

CROSS-REFERENCE TO RELATED APPLICATIONS

This application is a continuation of PCT Application No. PCT/KR2009/005492 filed on Sep. 25, 2009, which claims the benefit and priority to Korean Patent Application No. 10-2008-0093969, filed Sep. 25, 2008. The entire disclosures of the applications identified in this paragraph are incorporated herein by reference.

FIELD

The present disclosure relates generally to a III-nitride semiconductor light-emitting device, and more particularly, to an electrode structure of a nitride semiconductor light-emitting device. The nitride semiconductor light-emitting device refers to a light-emitting device such as a light-emitting diode including a compound semiconductor layer composed of $Al_{(x)}Ga_{(y)}In_{(1-x-y)}N$ ($0 \leq x \leq 1$, $0 \leq y \leq 1$, $0 \leq x+y \leq 1$), and may further include a material composed of other group elements, such as SiC, SiN, SiCN and CN, and a semiconductor layer made of such materials.

BACKGROUND

This section provides background information related to the present disclosure which is not necessarily prior art.

Figure 1:
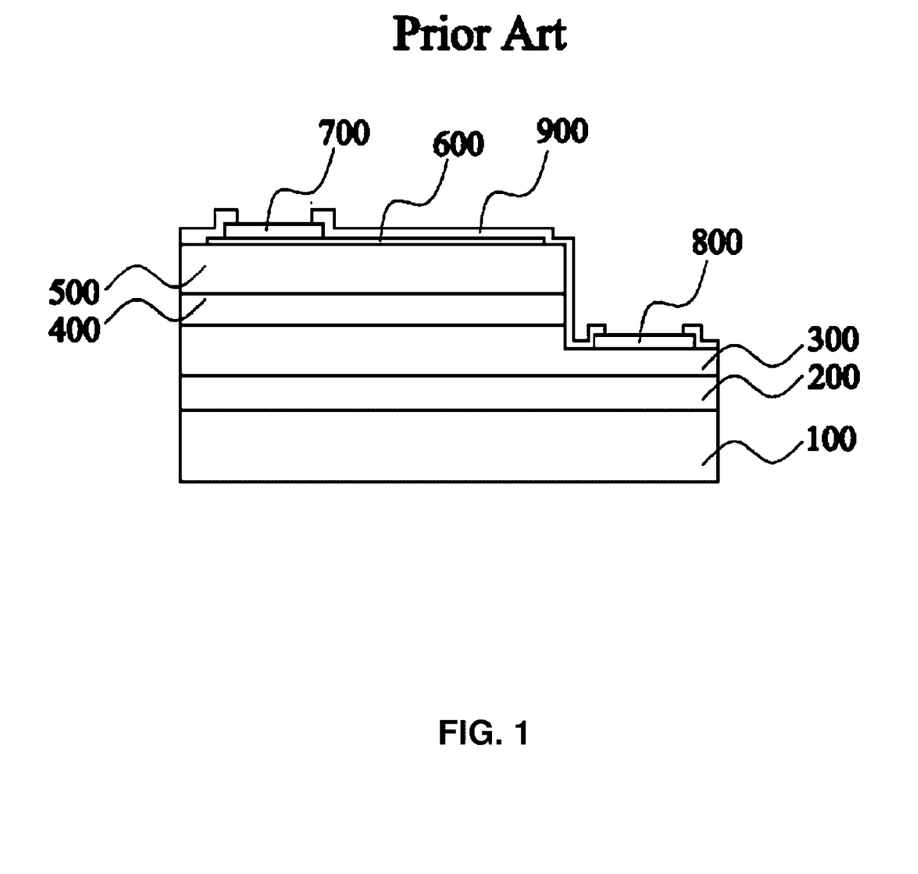
FIG. 1 is a view of an example of a conventional III-nitride semiconductor light-emitting device.

FIG. 1 is a view of an example of a conventional III-nitride semiconductor light-emitting device. The III-nitride semiconductor light-emitting device includes a substrate 100, a buffer layer 200 grown on the substrate 100, an n-type nitride semiconductor layer 300 grown on the buffer layer 200, an active layer 400 grown on the n-type nitride semiconductor layer 300, a p-type nitride semiconductor layer 500 grown on the active layer 400, a p-side electrode 600 formed on the p-type nitride semiconductor layer 500, a p-side bonding pad 700 formed on the p-side electrode 600, an n-side electrode 800 formed on the n-type nitride semiconductor layer 300 exposed by mesa-etching the p-type nitride semiconductor layer 500 and the active layer 400, and a protection film 900.

In the case of the substrate 100, a GaN substrate can be used as a homo-substrate. A sapphire substrate, a SiC substrate or a Si substrate can be used as a hetero-substrate. However, any type of substrate that can have a nitride semiconductor layer grown thereon can be employed. In the case that the SiC substrate is used, the n-side electrode 800 can be formed on the surface of the SiC substrate.

The nitride semiconductor layers epitaxially grown on the substrate 100 are usually grown by metal organic chemical vapor deposition (MOCVD).

The buffer layer 200 serves to overcome differences in lattice constant and thermal expansion coefficient between the hetero-substrate 100 and the nitride semiconductor layers. U.S. Pat. No. 5,122,845 describes a technique of growing an AlN buffer layer with a thickness of 100 to 500 Å on a sapphire substrate at 380 to 800° C. In addition, U.S. Pat. No. 5,290,393 describes a technique of growing an $Al_{(x)}Ga_{(1-x)}N$ ($0 \leq x < 1$) buffer layer with a thickness of 10 to 5000 Å on a sapphire substrate at 200 to 900° C. Moreover, PCT Publication No. WO/05/053042 describes a technique of growing a SiC buffer layer (seed layer) at 600 to 990° C., and growing an $In_{(x)}Ga_{(1-x)}N$ ($0 < x \leq 1$) thereon. In particular, there is provided with an undoped GaN layer with a thickness of 1 micron to several microns (μm) on the AlN buffer layer, the $Al_{(x)}Ga_{(1-x)}N$ ($0 \leq x < 1$) buffer layer or the $SiC/In_{(x)}Ga_{(1-x)}N$ ($0 < x \leq 1$) layer.

In the n-type nitride semiconductor layer 300, at least the n-side electrode 800 formed region (n-type contact layer) is doped with a dopant. In a particular embodiments, the n-type contact layer is made of GaN and doped with Si. U.S. Pat. No. 5,733,796 describes a technique of doping an n-type contact layer at a target doping concentration by adjusting the mixture ratio of Si and other source materials.

The active layer 400 generates light quanta by recombination of electrons and holes. For example, the active layer 400 contains $In_{(x)}Ga_{(1-x)}N$ ($0 < x \leq 1$) and has a single layer or multi-quantum well layers.

The p-type nitride semiconductor layer 500 is doped with an appropriate dopant such as Mg, and has p-type conductivity by an activation process. U.S. Pat. No. 5,247,533 describes a technique of activating a p-type nitride semiconductor layer by electron beam irradiation. Moreover, U.S. Pat. No. 5,306,662 describes a technique of activating a p-type nitride semiconductor layer by annealing over 400° C. PCT Publication No. WO/05/022655 describes a technique of endowing a p-type nitride semiconductor layer with p-type conductivity without an activation process, by using ammonia and a hydrazine-based source material together as a nitrogen precursor for growing the p-type nitride semiconductor layer.

The p-side electrode 600 is provided to facilitate current supply to the p-type nitride semiconductor layer 500. U.S. Pat. No. 5,563,422 describes a technique associated with a light-transmitting electrode composed of Ni and Au and formed almost on the entire surface of the p-type nitride semiconductor layer 500 and in ohmic-contact with the p-type nitride semiconductor layer 500. In addition, U.S. Pat. No. 6,515,306 describes a technique of forming an n-type superlattice layer on a p-type nitride semiconductor layer, and forming a light-transmitting electrode made of indium tin oxide (ITO) thereon.

The p-side electrode 600 can be formed thick as to not transmit but rather to reflect light toward the substrate 100. This technique is called the flip chip technique. U.S. Pat. No. 6,194,743 describes a technique associated with an electrode structure including an Ag layer with a thickness over 20 nm, a diffusion barrier layer covering the Ag layer, a bonding layer containing Au and Al, and covering the diffusion barrier layer.

The p-side bonding pad 700 and the n-side electrode 800 are provided for current supply and external wire bonding. U.S. Pat. No. 5,563,422 describes a technique of forming an n-side electrode with Ti and Al.

The optional protection film 900 can be made of $SiO_2$.

The n-type nitride semiconductor layer 300 or the p-type nitride semiconductor layer 500 can be constructed as a single layer or as plural layers. Vertical light-emitting devices are introduced by separating the substrate 100 from the nitride semiconductor layers using a laser technique or wet etching.

Figure 2:
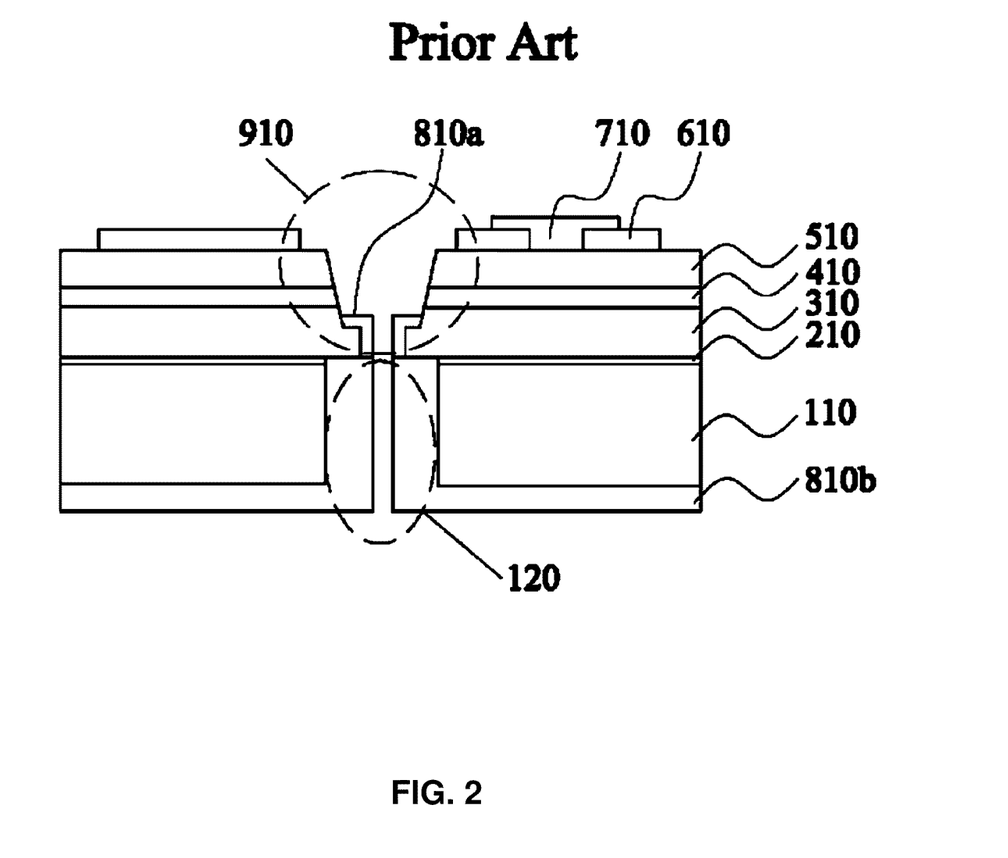
FIG. 2 is a view of another example of a III-nitride semiconductor light-emitting device disclosed in PCT Publication No. WO/2008/026902.

FIG. 2 is a view of an example of a III-nitride semiconductor light-emitting device described in PCT Publication No. WO/2008/026902. The III-nitride semiconductor light-emitting device includes a substrate 110, a buffer layer 210, an n-type III-nitride semiconductor layer 310, an active layer 410, a p-type III-nitride semiconductor layer 510, a p-side electrode 610, a p-side bonding pad 710, a first n-side electrode 810a, a second n-side electrode 810b, and an opening 910. The substrate 110 is formed of sapphire and has a groove 120 formed therein.

The opening 910 is formed on the groove 120 along and through the plurality of III-nitride semiconductor layers 210, 310, 410 and 510, the optional first n-side electrode 810a is formed on the n-type III-nitride semiconductor layer 310 in the opening 910, and the second n-side electrode 810b is brought into contact with the n-type III-nitride semiconductor layer 310 through the groove 120, such that the III-nitride semiconductor light-emitting device becomes a vertical light-emitting device. Here, the optional first n-side electrode 810a serves to ensure contact between the second n-side electrode 810b and the n-type III-nitride semiconductor layer 310.

The light-emitting device as described in PCT publication No. WO/2008/026902 has a disadvantage in that, since the groove 120 and the opening 910 penetrate through the light-emitting device, a material such as epoxy may go up from the bottom of the light-emitting device during fabrication of the package. This light-emitting device also has the disadvantage that a process for bonding a wire to the p-side bonding pad 710 is necessary during fabrication of the package, subsequently increasing the size of the package because the bonded wire should be sufficiently wrapped in order to be protected.

SUMMARY

This section provides a general summary of the disclosure, and is not a comprehensive disclosure of its full scope or all of its features.

There is provided herein a III-nitride semiconductor light-emitting device, including: a substrate with a first groove and a second groove formed therein, the substrate including a first surface and a second surface opposite to the first surface; a plurality of III-nitride semiconductor layers including a first III-nitride semiconductor layer formed over the first surface of the substrate and having a first conductivity type, a second III-nitride semiconductor layer formed over the first III-nitride semiconductor layer and having a second conductivity type different from the first conductivity type, and an active layer positioned between the first and second III-nitride semiconductor layers and generating light by recombination of electrons and holes; a first opening formed on the first groove along the plurality of III-nitride semiconductor layers; a second opening formed on the second groove along the plurality of III-nitride semiconductor layers; a first electrode electrically connected from the second surface of the substrate to the first III-nitride semiconductor layer in the first opening through the first groove; and a second electrode electrically connected from the second surface of the substrate to the second III-nitride semiconductor layer through the second groove and the second opening.

According to one aspect of the present disclosure, a III-nitride semiconductor light-emitting device which includes the electrodes formed by plating can be provided.

According to another aspect of the present disclosure, a III-nitride semiconductor light-emitting device which can be easily mounted during fabrication of the package can be provided.

According to still another aspect of the present disclosure, a III-nitride semiconductor light-emitting device which allows fabrication of a package of small size can be provided.

According to yet another aspect of the present disclosure foreign substances can be prevented from going up from the bottom of a III-nitride semiconductor light-emitting device.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

The present disclosure will now be described in detail with reference to the accompanying drawings.

Figure 3:
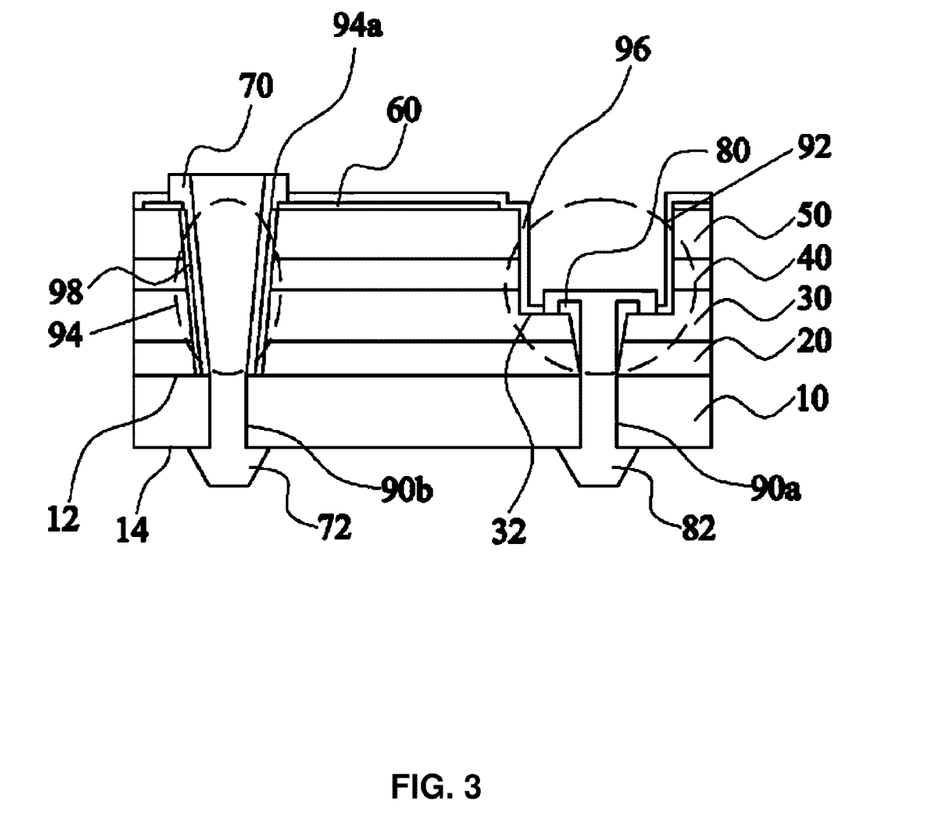
FIG. 3 is a view of an embodiment of a III-nitride semiconductor light-emitting device according to the present disclosure.

FIG. 3 is a view of an embodiment of a III-nitride semiconductor light-emitting device according to the present disclosure. The III-nitride semiconductor light-emitting device includes a substrate 10, a buffer layer 20, an n-type III-nitride semiconductor layer 30, an active layer 40, a p-type III-nitride semiconductor layer 50, a p-side electrode 60, a first electrode 82, a second electrode 72, a third electrode 80, a fourth electrode 70, a first opening 92, a second opening 94, an optional protection film 96, and a protection film 98.

The substrate 10, which may be formed of sapphire, includes a first surface 12 and a second surface 14 opposite to the first surface 12 and has a first groove 90a and a second groove 90b formed therein.

The buffer layer 20 is epitaxially grown on the first surface 12 of the substrate 10. The n-type III-nitride semiconductor layer 30 is epitaxially grown on the buffer layer 20 and has n-type conductivity. The active layer 40 is epitaxially grown on the n-type III-nitride semiconductor layer 30 and generates light by recombination of electrons and holes. The p-type III-nitride semiconductor layer 50 is epitaxially grown on the active layer 40 and has p-type conductivity. The p-side electrode 60 is formed on the p-type III-nitride semiconductor layer 50 and facilitates the current supply to the p-type III-nitride semiconductor layer 50.

The first opening 92 is formed on the first groove 90a along the buffer layer 20, the n-type III-nitride semiconductor layer 30, the active layer 40 and the p-type III-nitride semiconductor layer 50, and the second opening 94 is formed on the second groove 90b along the buffer layer 20, the n-type III-nitride semiconductor layer 30, the active layer 40 and the p-type III-nitride semiconductor layer 50. The n-type III-nitride semiconductor layer 30 is provided with a step 32 in the first opening 92 to form the third electrode 80 thereon.

The optional protection film 96 is formed over the first opening 92 and the p-side electrode 60 to protect the light-emitting device from the exterior or electrically insulate the same. The protection film 98 is formed on the second opening 94 to electrically insulate the buffer layer 20, the n-type III-nitride semiconductor layer 30 and the active layer 40 from the fourth electrode 70.

The third electrode 80 is formed on the step 32 to be in contact with the n-type III-nitride semiconductor layer 30 and serves as a seed when the first electrode 82 is formed by plating.

The fourth electrode 70 is formed at an upper part 94a of the second opening 94 to be in contact with the p-side electrode 60 and serves as a seed when the second electrode 72 is formed by plating.

The first electrode 82 is connected from the second surface 14 of the substrate 10 to the third electrode 80 in the first opening 92 through the first groove 90a. Here, the first electrode 82 is formed in the first groove 90a to prevent foreign substances from going up from the bottom of the light-emitting device. In the meantime, since the first electrode 82 protrudes from the second surface 14 of the substrate 10, it is possible to mount the light-emitting device on the substrate 10 for use in fabricating the package without special wire bonding.

The second electrode 72 is connected from the second surface 14 of the substrate 10 to the fourth electrode 70 through the second groove 90b and the second opening 94. At this time, the second electrode 72 is formed in the second groove 90b to prevent foreign substances from going up from the bottom of the light-emitting device. Meanwhile, since the second electrode 72 protrudes from the second surface 14 of the substrate 10, the light-emitting device can be mounted on the substrate 10 for use in fabricating the package without special wire bonding.

Hereinafter, a method for fabricating the III-nitride semiconductor light-emitting device according to the present disclosure will now be described.

First, the grooves 90a and 90b are formed in the first surface 12 of the substrate 10 using a laser. When focused, the laser can form the grooves 90a and 90b in various shapes such as circle, ellipse, or polygons at a diameter of a few microns to a few hundreds of microns by using a 355 nm wavelength. In addition, the depth of the grooves 90a and 90b can be adjusted from a few microns to a few hundreds of microns by the energy of the laser or the like. As the substrate 10 is polished from the second surface 14, the grooves 90a and 90b penetrate through the substrate 10.

Next, the buffer layer 20, the n-type III-nitride semiconductor layer 30, the active layer 40, and the p-type III-nitride semiconductor layer 50 are epitaxially grown on the first surface 12 of the substrate 10. Here, the growth conditions (including growth temperature, growth speed, and growth pressure, etc.) are controlled to prevent the lateral growth. That is, the opening 92 and 94 are formed on the grooves 90a and 90b in the growth conditions in which the lateral growth does not occur. For example, with respect to the n-type III-nitride semiconductor layer 30, when TMGa, $NH_3$ and $SiH_4$ are supplied by 365 sccm, 11 slm and 8.5 slm, respectively, and treated in the growth conditions such as a growth temperature of 1050° C., a doping concentration of $3 \times 10^{18}/cm^3$ and a pressure of 300 torr to 500 torr, about a 4-μm GaN layer is grown. Thus the opening 92 and 94 can be formed (in this case, circular grooves 90a and 90b having a diameter of 30 μm are used).

Next, the p-side electrode 60 is formed on the p-type III-nitride semiconductor layer 50. Then, the n-type III-nitride semiconductor layer 30 is exposed. The step 32 is formed during this process. The n-type III-nitride semiconductor layer 30 may be exposed by dry etching, wet etching, or both. Accordingly, the third electrode 80 can be formed on the step 32 to be connected to the n-type III-nitride semiconductor layer 30. Meanwhile, the step 32 increases the contact area between the n-type III-nitride semiconductor layer 30 and the first electrode 82 or the third electrode 80, thereby facilitating the current supply. The p-side electrode 60 may be formed after the etching process for exposing the n-type III-nitride semiconductor layer 30.

Next, the protection film 98 is formed on the second opening 94. Here, the protection film 98 may be formed of photoresist, $SiO_x$, $SiN_x$, BCB, polyimide, etc. The optional protection film 96 may be formed at the same time during this process.

Next, the third electrode 80 and the fourth electrode 70 are formed. The third electrode 80 and the fourth electrode 70 may be formed by sputtering, E-beam evaporation, thermal deposition, or the like. The third electrode 80 and the fourth electrode 70 may be formed of any one selected from the group consisting of Ni, Au, Ag, Cr, Ti, Pt, Pd, Rh, Ir, Al, Sn, In, Ta, Cu, Co, Fe, Ru, Zr, W and Mo, or any combination thereof.

During this process, as the second opening 94 is inclinedly formed, the fourth electrode 70 may be formed on the inclined part of the second opening 94 as well as the upper part 94a thereof. Here, the fourth electrode 70 is formed at the upper part 94a of the second opening 94 so that plating can proceed from the fourth electrode 70 formed at the upper part 94a of the second opening 94 to the second surface 14 of the substrate 10 using the fourth electrode 70 as a seed during the process for forming the second electrode 72 by plating. As such, the second electrode 72 can be continuously formed without interruption. Moreover, the third electrode 80 is formed on the step 32 so that the first electrode 82 can be continuously formed from the step 32 of the first opening 92 to the second surface 14 of the substrate 10 using the third electrode 80 as a seed during the process for forming the first electrode 82 by plating.

Next, the second surface 14 of the substrate 10 is polished. The substrate 10 is polished to at least the region in which the grooves 90 have been formed, thereby exposing the grooves 90 formed from the first surface 12 of the substrate 10 to the outside. The process for polishing the substrate 10 may be omitted when the grooves 90 penetrate through the first surface 12 and the second surface 14 of the substrate 10.

Next, the first electrode 82 and the second electrode 72 are formed by plating. The plating may be electroplating. According to the electroplating, an object to be plated is connected to the negative (−) pole and a plating material is connected to the positive (+) pole. Here, the plating material is a solution containing metal ions of high electric conductivity, such as Au, Ag, Cu, Al, etc. When the current is applied to the solution containing metal ions of high electric conductivity, the reduction reaction occurs at the negative (−) pole and the oxidation reaction occurs at the positive (+) pole. Here, the first electrode 82 and the second electrode 72 are formed of the metal ions contained in the solution on the object to be plated which is connected to the negative (−) pole due to the reduction reaction. Before the electroplating, a protection film can be formed on parts other than the plating part to prevent plating. The protection film may be a blue tape or the like.

Figure 4:
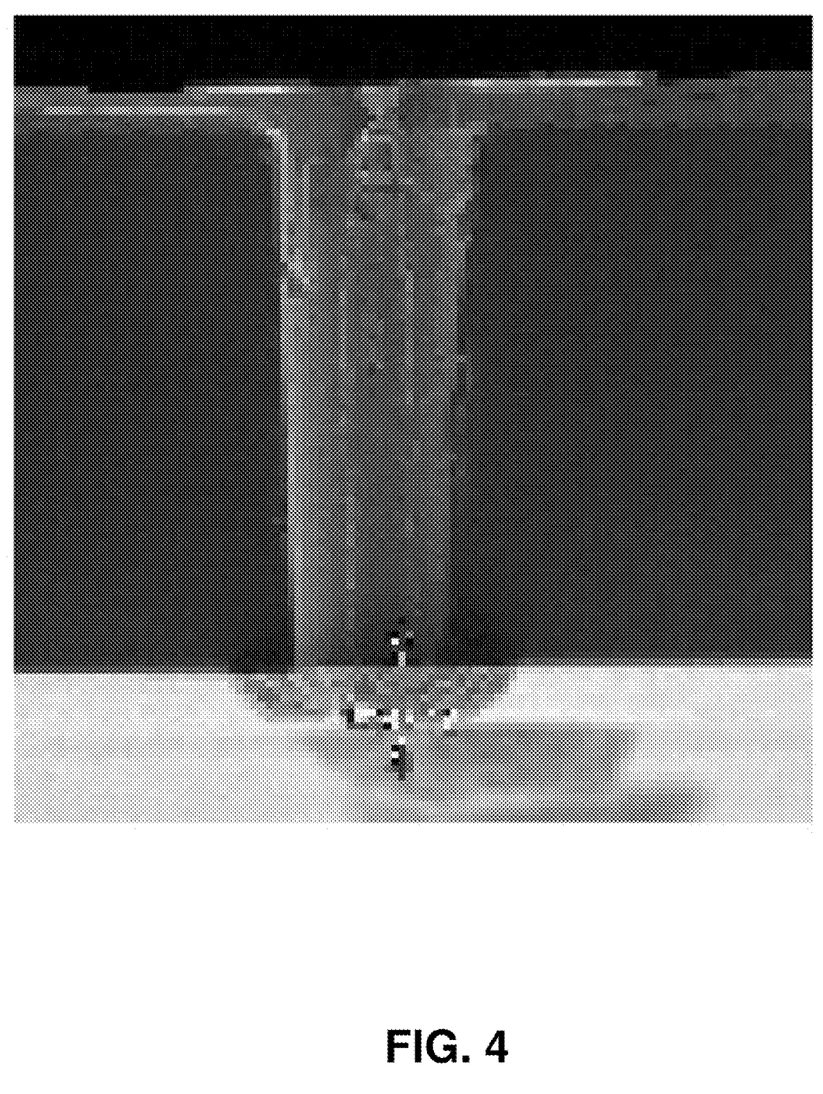
FIG. 4 is a scanning electron microscope (SEM) image of a III-nitride semiconductor light-emitting device according to the present disclosure.

FIG. 4 is an SEM image of the III-nitride semiconductor light-emitting device according to the present disclosure, particularly, a profile of the light-emitting device showing the first electrode (82; referring to FIG. 3). Hereinafter, an example of the electroplating will now be described.

The electroplating was performed using Cu as a plating material. According to the electroplating, the light-emitting device to be plated was connected to the negative (−) pole and Pt or phosphorized Cu (P: 0.04% to 0.06%) was connected to the positive (+) pole. Here, an electrolyte solution used was a sulfuric-acid-based solution and might be a general plating solution or a self-prepared solution.

The plating temperature was maintained at 20° C. If the plating temperature is over 30° C., the plating surface may be roughened, the plating attachment may be reduced, and the protective film adhesiveness, such as the adhesiveness of blue tape, may be weakened.

The current was maintained at 150 mA. If a higher current is applied, it is difficult to achieve uniform plating. Moreover, for smooth plating, the plating solution was made to continuously flow, and the light-emitting device was made to move in a circle.

In the above example, the electroplating time was about 95 min.

Figure 5:
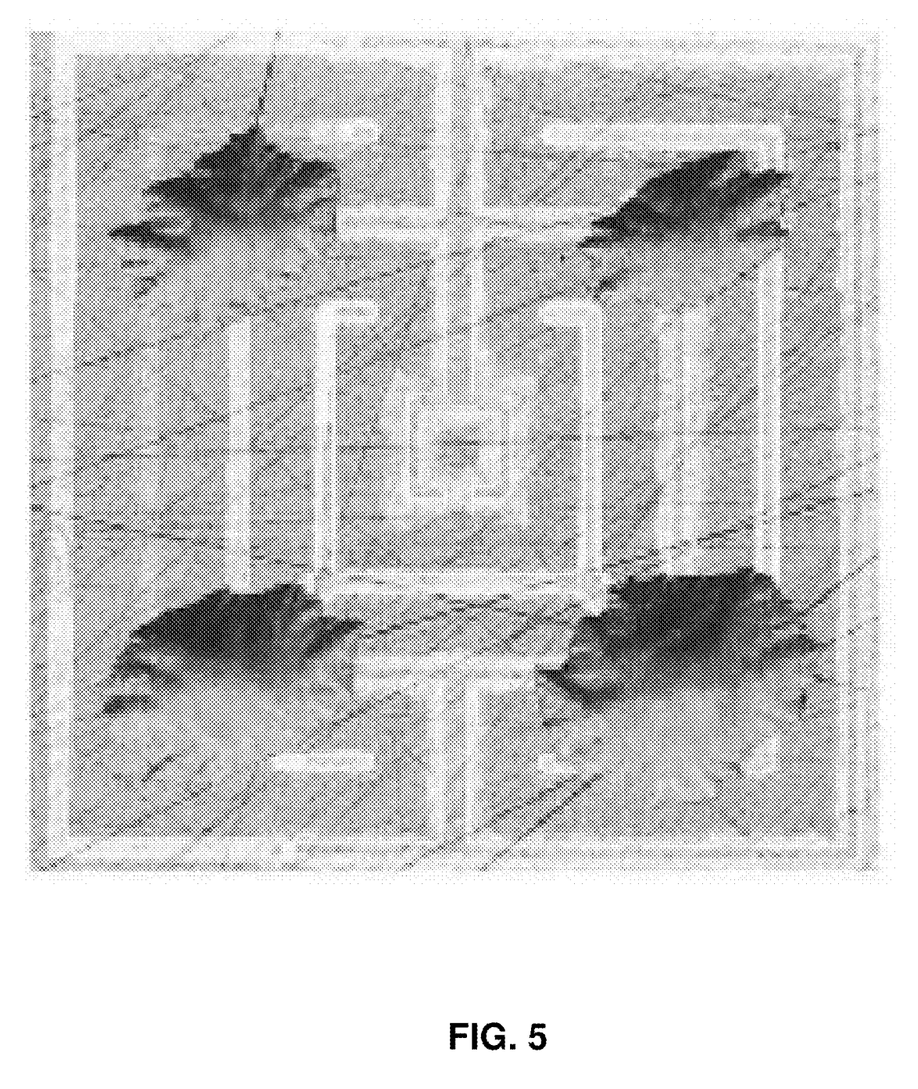
FIG. 5 is another SEM image of a III-nitride semiconductor light-emitting device according to the present disclosure.

FIG. 5 is another SEM image of the III-nitride semiconductor light-emitting device according to the present disclosure, particularly, the second surface (14: referring to FIG. 3) of the substrate (10: referring to FIG. 3) of the light-emitting device from which the electrodes protrude outwardly.

Hereinafter, variety examples of the present disclosure are explained.

(1) The III-nitride semiconductor light-emitting device further comprising a protection film disposed on the first opening and electrically insulating the first electrode from the plurality of III-nitride semiconductor layers except the first III-nitride semiconductor layer.

(2) The III-nitride semiconductor light-emitting device further comprising a protection film disposed on the second opening and electrically insulating the second electrode from the plurality of III-nitride semiconductor layers except the second III-nitride semiconductor layer.

(3) The III-nitride semiconductor light-emitting device further comprising a third electrode disposed between the first III-nitride semiconductor layer and the first electrode in the first opening and electrically connected to the first III-nitride semiconductor layer and the first electrode.

(4) The III-nitride semiconductor light-emitting device further comprising a fourth electrode disposed between the second III-nitride semiconductor layer and the second electrode and electrically connected to the second III-nitride semiconductor layer and the second electrode.

(5) The III-nitride semiconductor light-emitting device wherein the first opening and the second opening are formed by the first groove and the second groove during the growth of the plurality of III-nitride semiconductor layers.

(6) The III-nitride semiconductor light-emitting device wherein the substrate is formed of sapphire.

(7) The III-nitride semiconductor light-emitting device wherein the plurality of III-nitride semiconductor layers comprise a buffer layer epitaxially grown on the first surface of the substrate, an n-type III-nitride semiconductor layer epitaxially grown on the buffer layer, a p-type III-nitride semiconductor layer epitaxially grown on the n-type III-nitride semiconductor layer, and an active layer disposed between the n-type and p-type III-nitride semiconductor layers and generating light by recombination of electrons and holes.

(8) The III-nitride semiconductor light-emitting device comprising: a p-side electrode formed on the p-type III-nitride semiconductor layer; a third electrode formed on the n-type III-nitride semiconductor layer exposed by etching the p-type III-nitride semiconductor layer and the active layer; and a fourth electrode electrically connected to the p-side electrode, wherein the first electrode is electrically connected from the second surface of the substrate to the third electrode in the first opening through the first groove, and the second electrode is electrically connected from the second surface of the substrate to the fourth electrode through the second groove and the second opening.

(9) The III-nitride semiconductor light-emitting device comprising a protection film formed on the second opening and electrically insulating the fourth electrode from the plurality of III-nitride semiconductor layers except the p-type III-nitride semiconductor layer.

(10) The III-nitride semiconductor light-emitting device wherein the first electrode and the second electrode are formed to fill up the grooves.

(11) The III-nitride semiconductor light-emitting device wherein the first electrode and the second electrode protrude from the second surface of the substrate.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

What is claimed is:

1. A III-nitride semiconductor light-emitting device, comprising:
a substrate with a first groove and a second groove formed therein, the substrate including a first surface and a second surface opposite to the first surface;
a plurality of III-nitride semiconductor layers including a first III-nitride semiconductor layer formed over the first surface of the substrate and having a first conductivity type, a second III-nitride semiconductor layer formed over the first III-nitride semiconductor layer and having a second conductivity type different from the first conductivity type, and an active layer disposed between the first and second III-nitride semiconductor layers and generating light by recombination of electrons and holes;
a first opening formed on the first groove along the plurality of III-nitride semiconductor layers;
a second opening formed on the second groove along the plurality of III-nitride semiconductor layers;
a first electrode electrically connected from the second surface of the substrate to the first III-nitride semiconductor layer in the first opening through the first groove; and a second electrode electrically connected from the second surface of the substrate to the second III-nitride semiconductor layer through the second groove and the second opening.

2. The III-nitride semiconductor light-emitting device of claim 1, further comprising a protection film disposed on the first opening and electrically insulating the first electrode from the plurality of III-nitride semiconductor layers except the first III-nitride semiconductor layer.

3. The III-nitride semiconductor light-emitting device of claim 1, further comprising a protection film disposed on the second opening and electrically insulating the second electrode from the plurality of III-nitride semiconductor layers except the second III-nitride semiconductor layer.

4. The III-nitride semiconductor light-emitting device of claim 1, further comprising a third electrode disposed between the first III-nitride semiconductor layer and the first electrode in the first opening and electrically connected to the first III-nitride semiconductor layer and the first electrode.

5. The III-nitride semiconductor light-emitting device of claim 1, further comprising a fourth electrode disposed between the second III-nitride semiconductor layer and the second electrode and electrically connected to the second III-nitride semiconductor layer and the second electrode.

6. The III-nitride semiconductor light-emitting device of claim 1, wherein the first opening and the second opening are formed by the first groove and the second groove during the growth of the plurality of III-nitride semiconductor layers.

7. The III-nitride semiconductor light-emitting device of claim 1, wherein the substrate is formed of sapphire.

8. The III-nitride semiconductor light-emitting device of claim 1, wherein the plurality of III-nitride semiconductor layers comprise a buffer layer epitaxially grown on the first surface of the substrate, an n-type III-nitride semiconductor layer epitaxially grown on the buffer layer, a p-type III-nitride semiconductor layer epitaxially grown on the n-type III-nitride semiconductor layer, and an active layer disposed between the n-type and p-type III-nitride semiconductor layers and generating light by recombination of electrons and holes.

9. The III-nitride semiconductor light-emitting device of claim 8, comprising:
a p-side electrode formed on the p-type III-nitride semiconductor layer;
a third electrode formed on the n-type III-nitride semiconductor layer exposed by etching the p-type III-nitride semiconductor layer and the active layer; and
a fourth electrode electrically connected to the p-side electrode, wherein the first electrode is electrically connected from the second surface of the substrate to the third electrode in the first opening through the first groove, and the second electrode is electrically connected from the second surface of the substrate to the fourth electrode through the second groove and the second opening.

10. The III-nitride semiconductor light-emitting device of claim 9, comprising a protection film formed on the second opening and electrically insulating the fourth electrode from the plurality of III-nitride semiconductor layers except the p-type III-nitride semiconductor layer.

11. The III-nitride semiconductor light-emitting device of claim 8, wherein the first electrode and the second electrode are formed to fill up the grooves.

12. The III-nitride semiconductor light-emitting device of claim 8, wherein the first electrode and the second electrode protrude from the second surface of the substrate.

* * * * *